(12) United States Patent  (10) Patent No.: US 8,112,754 B2
Shikano  (45) Date of Patent: Feb. 7, 2012

(54) CONTROLLING BODY-BIAS VOLTAGE AND CLOCK FREQUENCY IN A MULTIPROCESSOR SYSTEM FOR PROCESSING TASKS

(75) Inventor: Hiroaki Shikano, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 804 days.

(21) Appl. No.: 12/172,919

(22) Filed: Jul. 14, 2008

(65) Prior Publication Data

US 2009/0070772 A1  Mar. 12, 2009

(30) Foreign Application Priority Data

Sep. 11, 2007  (JP) .................................. 2007-234829

(51) Int. Cl.
*G06F 9/46*  (2006.01)
(52) U.S. Cl. ......................................... 718/102; 713/400
(58) Field of Classification Search .................. None
See application file for complete search history.

(56) References Cited

U.S. PATENT DOCUMENTS

| | | | | | |
|---|---|---|---|---|---|
| 6,097,113 | A | * | 8/2000 | Teraoka et al. ................ | 307/125 |
| 6,484,265 | B2 | * | 11/2002 | Borkar et al. .................. | 713/324 |
| 6,608,509 | B1 | | 8/2003 | Mizuno et al. | |
| 6,744,301 | B1 | * | 6/2004 | Tschanz et al. ................ | 327/534 |
| 7,493,149 | B1 | * | 2/2009 | Doyle et al. ................... | 455/574 |
| 2004/0123170 | A1 | * | 6/2004 | Tschanz et al. ............... | 713/320 |
| 2004/0123297 | A1 | * | 6/2004 | Flautner et al. ............... | 718/102 |
| 2006/0091935 | A1 | * | 5/2006 | Tschanz et al. ............... | 327/534 |
| 2007/0063284 | A1 | | 3/2007 | Kawahara et al. | |
| 2007/0255929 | A1 | | 11/2007 | Kasahara et al. | |
| 2007/0266385 | A1 | * | 11/2007 | Flautner et al. ............... | 718/102 |
| 2009/0015293 | A1 | * | 1/2009 | Ito et al. ......................... | 326/81 |
| 2009/0064167 | A1 | * | 3/2009 | Arimilli et al. ................ | 718/105 |

FOREIGN PATENT DOCUMENTS

| | | |
|---|---|---|
| JP | 08-274620 A | 10/1996 |
| JP | 2002-304232 A | 10/2002 |
| JP | 2006-293768 A | 10/2006 |
| JP | 2007-42730 A | 2/2007 |

OTHER PUBLICATIONS

Ishizaka et al., "Coarse Grain Task Parallel Processing with Cache Optimization on Shared Memory Multiprocessor", IPSJ Journal, vol. 43, No. 4, Apr. 2002, pp. 958-970.
Office Action issued Aug. 4, 2011 in counterpart Japanese Application JP 2007-234829.

* cited by examiner

*Primary Examiner* — Idriss N Alrobaye
(74) *Attorney, Agent, or Firm* — Miles & Stockbridge P.C.

(57) ABSTRACT

In case of a task scheduling processing that assigns plural divided execution program tasks to plural processor units, a multiprocessor system using SOI/MOS transistors employs two processes; one process is to determine an order to execute those tasks so as to reduce the program execution time and the other process is to control the system power upon task scheduling so as to control the clock signal frequency and the body-bias voltage to temporarily speed up the operation of a processor unit that processes another task that might affect the processing performance of one object task if there is dependency among those tasks.

11 Claims, 13 Drawing Sheets

FIG. 5

| Task ID | Dependent Task ID | Processing Time | Priority | Target PU | Shared Data Size |
|---|---|---|---|---|---|
| T0 | IT | 10 Kcyc | 5 | CPU | — |
| T1 | T0 | 30 Kcyc | 5 | CPU | T0>64 Kbytes |
| T2 | T0 | 15 Kcyc | 3 | CPU | T1>32 Kbytes |
| T3 | T1, T2 | 20 Kcyc | 5 | CPU | T1>1 Kbytes<br>T2>32 Kbytes |

| Task ID | Power Mode | Finish Time | Status |
|---|---|---|---|
| T2 | High-Vt | 25 Kcyc | Running |
| T3 | Low-Vt | 50 Kcyc | Assigned |
| T4 | — | 70 Kcyc | Assigning |

FIG. 14

```
for (j = 0; j < m; j++)                                    1.1
    scanf ("%d %d", &a [0] [j], &x [j]) ;

for (i = 1; i < n; i++) {                                  1.2
    for (j = 0; j < m; j++)
        a [i] [j] = a [i-1] [j] ;                          1.2.1 func1 (a, b) ;                                         1.2.2 func2 (b, c) ;                                         1.2.3 for (j = 0; j < m; j++)
        d [i] [j] = a [i] [j] * 4 ;                        1.2.4 func3 (b, d) ;                                         1.2.5
}
func4 (x, y) ;                                             1.3
} void func4 (x, y) {                                        1.3
    t = (x (0) + x (m)) / 2 ;                              1.3.1 for (j = 0; j < m; j++)
        y [j] = x [j] * 2 ;                                1.3.2 func4a (x, y)                                          1.3.3 for (j = 0; j < m; j++)
        y [j] = x [j] / 2 ;                                1.3.4
}
```

CONTROLLING BODY-BIAS VOLTAGE AND CLOCK FREQUENCY IN A MULTIPROCESSOR SYSTEM FOR PROCESSING TASKS

CLAIM OF PRIORITY

The present application claims priority from Japanese patent application JP 2007-234829 filed on Sep. 11, 2007, the content of which is hereby incorporated by reference into this application.

FIELD OF THE INVENTION

The present invention relates to a method that controls both the body-bias voltage and the clock frequency in a multiprocessor system, more particularly, to a technique to be applied effectively to a system-on-chip (SoC) semiconductor device.

BACKGROUND OF THE INVENTION

Now that a huge number of transistors have come to be integrated in devices due to the progress of fabricating techniques of semiconductors, as well as refining techniques of circuit elements, higher frequencies have also come to be employed for the synchronization signals of processors. At the same time, problems have arisen in the conventional processors; such device performance achieved by the improvement of both the operation frequency and the logical method has seemingly come to the limits, mainly because of the increase of the power consumption during operation and furthermore because of the increase of the stand-by power caused by the leakage current in the state of stand-by in those devices. On the other hand, there have appeared many digital consumer appliances, such as navigation systems of vehicles, portable phones, digital TV sets that handle various types of data, such as images, voices, database information, etc. And in order to cope with the processings of mass of such data having different characteristics quickly and with lower power consumption, techniques that can solve the problems are strongly demanded now. One of the methods to meet such demands has introduced as a means, which realizes both performance improvement and low power consumption. For example, one of such expected means is a multiprocessor system capable of realizing high performance of computation by integrating plural processor units on a single chip and enabling those processor units to execute plural processings in parallel although only one processor unit has been mounted on one chip conventionally. In this case, the present operation frequency can be used as is. In the near future, it is expected that the refining technique of circuit elements will further be advanced, thereby 100 to 1000 processor units (operation units) will come to be mounted on one chip.

In case of a system preferred particularly to built-in devices, standardized digital signals such as radio, image, and voice signals are often processed. And in order to cope with such digital processings and to provide a means that enables both performance improvement and low power consumption to stand together, there is proposed a homogeneous multiprocessor system in which plural general processing devices are integrated. Those processing devices use the same general processing method, that is, the same instruction set and those devices are the same in configuration and operation performance characteristics. In addition to the homogeneous multiprocessor system, there is also proposed a heterogeneous multiprocessor system intended to improve the operation efficiency particularly for some kinds of application programs by integrating various types of such processing devices as dedicated processors and accelerators, each of which is capable of executing a specific processing very efficiently (at a high speed and at low power consumption) on a single chip. The instruction set differs among those processing devices.

In case of such a multiprocessor system that integrates plural processor units (PU) on one chip as described above, it is required to create its programs so that the plurality of PUs can operate simultaneously and efficiently to bring out the system performance fully. And in case of ordinary input programs, processings are described one by one in the time series, so that the arithmetic performance cannot be brought out as expected for the number of integrated PUs. If the parallelization property is taken into consideration particularly upon creating a program, one of the effective methods to solve the above problems is addition of parallelizing codes to the program so as to enable the program to be executed in plural PUs in accordance with the configuration of the subject multiprocessor system that executes the program. In this case, the method is effective for systems in each of which several PUs are integrated. And if the development time and effective performance of the system is taken into consideration, however, the method is not so practical for systems in each of which several tens to several thousands of PUs are integrated, more particularly not practical for systems in each of which different types of PUs are integrated. JP-A-2006-293768 discloses a static PU power control method that solves this problem. According to the method, a program is divided into plural tasks by a parallelizing compiler, the divided tasks are analyzed in parallel and scheduled to be distributed to plural PUs in parallel at the time of compiling. And according to the result of the parallel scheduling, the power of each PU is controlled statically.

There are also other device techniques that can realize the above described processor. The main stream of such device techniques has been a CMOS (Complementary Metal-Oxide-Semiconductor) technique and as described above, the performance of transistors has been improved by increasing the number of transistors to be mounted in accordance with the transistor scaling and by improving the clock frequency by quickening the switching speed of those transistors. However, for the reasons described above and due to such problems as leakage current, etc., it is now difficult to furthermore expect improvement of the refining technique with any conventional methods. In such a situation, there has been proposed a SOI (Silicon on Insulator) structure that forms a silicon crystal layer on an insulated substrate and forms transistors on the silicon layer. The SOI structure is expected to realize faster devices while suppressing the leakage current. In addition, this SOI structure can suppress the substrate capacity and quicken the switching speed of transistors more, thereby making it easier to control the body-bias level (body-bias control), which has been difficult on conventional silicon substrates. And the technique can realize both faster operations and low power consumption. SOI-structured transistors are divided into two types; fully-depleted MOS transistors (FD-SOI/MOS transistors) having a silicon layer formed on an insulation film respectively and partially-depleted transistors (PD-SOI/MOS transistors) having a thick silicon layer respectively. In case of the fully-depleted MOS transistors, the channel region (body part) is fully depleted during operation and the charge that forms a channel (inverted layer) can move free of the influence of the substrate, thereby the influence by the gate voltage on the charge of the inverted layer becomes more dominant and comes to have more favorable subthreshold characteristics than that of the partially-depleted structure, etc.

Particularly, in case of the bulk CMOS that has not employed the conventional SOI structure, the following problems have arisen; the substrate requires a large capacity; a voltage generation circuit with a stronger driving power is required to apply a voltage to the substrate; the body-bias level control time is long; an excessive voltage often flows due to a latch-up phenomenon caused by the transistor elements that are not separated from each another, thereby noise is generated from the substrate. Consequently, it has not been practical to apply the body-bias level in the positive direction (in which the threshold voltage is minimized) and to switch the body-bias level quickly. In spite of this, employment of the SOI technique can realize faster body-bias controlling to cope with various particle sizes.

JP-A-2007-042730 discloses a method that realizes a semiconductor device capable of fast operations with low power consumption in a wide range of ambient temperatures. The method uses FD-SOI transistors having a thin buried oxide layer respectively, uses the lower semiconductor region of the thin buried oxide layer as a back gate, and controls the voltage of the back gate from outside for each light load logic circuit in the logical circuit block each in its proper way according to the operation characteristic of the circuit at the timing of the block activation.

Furthermore, JP-A-2002-304232 discloses a power control method employed for semiconductor circuits. The method controls the clock frequency/supply voltage. Concretely, upon executing a task having sufficient processing time, the method lowers both the clock frequency and the supply voltage to reduce the device power consumption. In this case, however, the voltage change control time is very long and a power supply circuit with a high driving power is required to drive the power supply, thereby the overhead becomes large with respect to the area. However, the method has been confronted with some problems. And as devices have been refined in structure more and more in recent years, the supply voltage is also scaled. For example, in case of the CMOS in the 65 nm generation, the supply voltage is lowered up to 1.0 V. Consequently, the supply voltage can be lowered stably within 0.8 to 0.9 V. This makes it expect that process refining is more advanced, for example, up to 45 nm and under, so that the voltage is lowered, almost to zero. Thus it becomes difficult to employ any of the conventional voltage lowering methods here. Furthermore, along with the progress of the refining technique, it is required not only to lower the supply voltage, but also to combine plural methods such as body-bias controlling to reduce the device power consumption while the charging/discharging current that is a switching current, has been dominant in the power consumption often. This is to prevent the problem that various types of leakage currents flow constantly in switches.

SUMMARY OF THE INVENTION

In recent years, there have been strong demands for improving the performance of processors while various types of application programs have been born. Those programs handle diversified data such as image, voice, and database information of navigation systems of vehicles, portable phones, and digital TV sets simultaneously. And in order to meet the demand, there has been proposed a multiprocessor system that includes plural processor units (PU) and enable a program divided into plural tasks that runs in parallel in those processor units, thereby improving the performance of the subject processor system. In this case, it is not required to raise the operation frequency. Such multiprocessor systems are the main stream. Under such circumstances, therefore, the present inventor has made examinations and concluded as follows. In order to utilize plural processor units (PU) efficiently, it is required to assign plural tasks that can be parallelized to many processor units (PU) efficiently. Furthermore, in case of a multiprocessor system, there might arise some cases upon executing those tasks. For example, divided tasks are not always executed simultaneously because of the data and control dependency among those tasks and any one of the processor units (PU) enters the idle state, since the processor unit is forced to wait for the completion of the task of the other processor unit. And in order to improve the efficiency of the task execution in the whole system from the viewpoint of the performance and power-saving, it is required to speed up the execution time of a task that might affect the execution time of the whole system. And it is also required to slow down the execution time of other tasks that will not affect the execution time of the whole system from the viewpoint of the efficient utilization of the system power. Particularly, from the viewpoint of achieving low power consumption, it is required to control the system power as follows; each processor unit is controlled so as not to enter the idle state and to turn off the power supply to the idle processor units and to apply a body-bias to those processor units, since the power consumption is wasteful in the idle state.

Under such circumstances, it is an object of the present invention to provide a multiprocessor system capable of realizing the reduction of both task processing time and power consumption in multiple task processings.

The above and other objects, features, and advantages of the present invention will be apparent from the following detailed description of the preferred embodiments of the invention in conjunction with the accompanying drawings.

Hereunder, there will be described briefly typical one of the objects of the present invention disclosed in this specification.

Concretely, the typical one of the objects of the present invention is a multiprocessor system, which uses SOI/MOS transistors and makes task scheduling so that an execution program divided into plural tasks is assigned to plural processor units. At this time, the system executes the following three processes; the first process is to determine an order to execute the plurality of tasks so as to reduce the program execution time, the second process is to control the system power, thereby controlling both the clock signal frequency and the body-bias of those processor units so as to speed up the operation of one object processor unit that executes the other task that might affect the processing performance of the one object task while there is dependency between those tasks at the time of scheduling, and the third process is to control the system power, thereby controlling both the clock signal frequency and the body-bias of those processor units so as to slow down the operation of the processor unit that executes the other task that will not affect the processing performance of the one object task if there is dependency between those tasks at the time of scheduling.

The affect to be obtained by the typical one of the objects of the present invention disclosed in this specification will be as follows.

Concretely, the multiprocessor system of the present invention, which uses SOI/MOS transistors, can realize the reduction of both task processing time and power consumption in multiple task processings.

BRIEF DESCRIPTION OF THE DRAWINGS

FIG. 5 is a diagram that describes a table of dependency among tasks (scheduling table);

FIG. 14 is a diagram that describes an example of a program inputted to a compiler.

DETAILED DESCRIPTION OF THE PREFERRED EMBODIMENTS

1. Brief Description of an Embodiment

Figure 1:
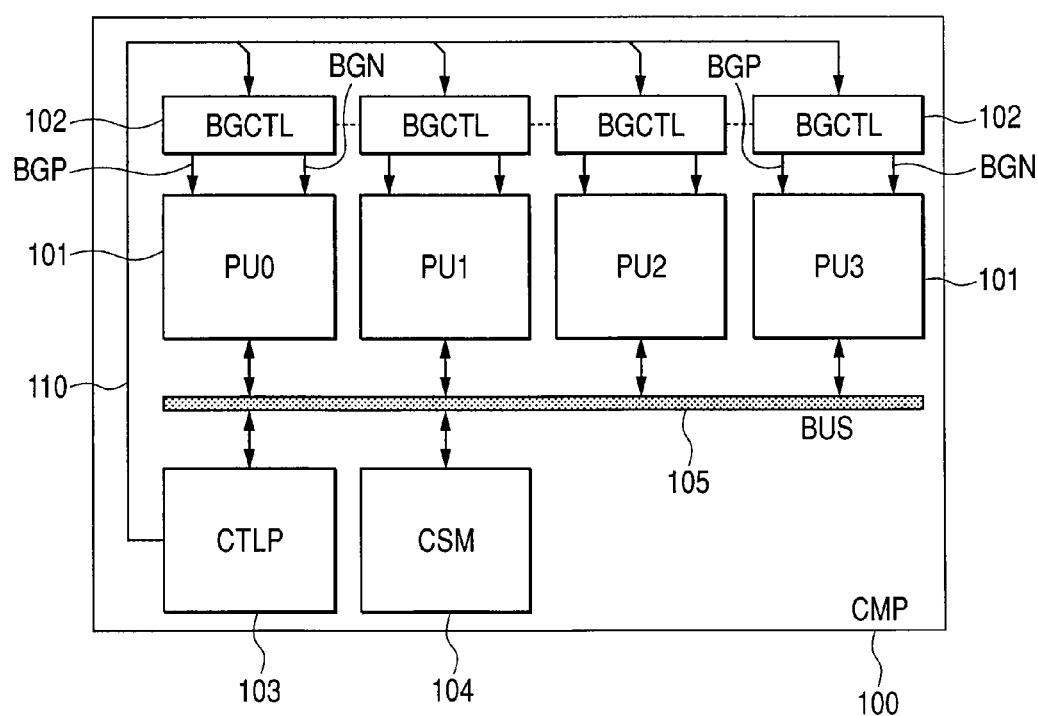
FIG. 1 is a block diagram of an example of a multiprocessor system of the present invention.

At first, there will be described briefly a typical embodiment of the present invention disclosed in this specification. Each reference numeral in parentheses in the accompanying drawings just denotes what is included in the concept of the subject component.

[1] The multiprocessor system includes plural processor units (101) that can operate in parallel, a body-bias control circuit (102), and a control processor unit (103). Each of the processor units (101) includes an internal circuit composed of silicon-on-insulator structured SOI/MOS transistors, each of which includes a back gate isolated from other MOS transistors electrically. The processor units (101) are synchronized with a clock signal in operation respectively. The body-bias control circuit (102) outputs a body-bias voltage to the back gate of each SOI/MOS transistor in the internal circuit. The control processor unit (103) makes task scheduling by taking consideration to the dependency among tasks so as to enable the plurality of processor units to process plural tasks in parallel. The control processor unit (103) also generates control data that controls the body-bias voltage and the clock signal frequency of each processor unit and determines the control data in the task scheduling upon processing one object task so as to reduce the processing time of the other task that might affect the start of the processing of the object task.

As described above, upon processing one object task, controlling the body-bias voltage and the clock signal frequency speeds up particularly the processing of the other task that might affect the start of the processing of the object task while there is dependency between those tasks. Furthermore, due to the device structure (silicon-on-insulator structure) employed for the SOI/MOS transistors in the internal circuit, both the substrate current leakage during operation and the idle time threshold current leakage of the substrate can be suppressed. This is why the multiprocessor system can realize the reduction of both task processing time and power consumption in its multitask processings.

[2] The multiprocessor system described in [1] includes a memory that stores a task scheduling table denoting a relationship of dependency among tasks. The control processor unit (103) refers to this task scheduling table to know the dependency among object tasks. This operation is effective to reduce the software development time more than that in a case in which the dependency among tasks is taken into consideration upon compiling a source program. The effect will be more remarkable when the number of processor units to be provided in the multiprocessor system further increases.

[3] In the multiprocessor system described in [1], the control processor unit (103) determines the control data so as to reduce the threshold voltage of the SOI/MOS transistors and raise the clock signal frequency with respect to the internal circuit of the processor unit that processes the other task. Because the threshold voltage of the SOI/MOS transistors is reduced through the body-bias controlling and a higher frequency is employed for the clock signal in such a way, the circuit state transition time is reduced and the circuit operation is speeded up. Furthermore, because the SOI/MOS transistors employ the silicon-on-insulator structure, the current leak to the substrate is prevented and the sub-threshold leakage current in the idle state is reduced even when the threshold voltage is low and those transistors are turned on, thereby the power consumption is reduced.

[4] In the multiprocessor system described in [1], if one object task is to be processed after the completion of the other task processing, the control processor unit (103) determines the control data so as to reduce the threshold voltage of the SOI/MOS transistors and raise the clock signal frequency with respect to the internal circuit of the processor unit that processes the other task.

[5] In the multiprocessor system described in [4], if, upon processings one object task, a different task that might affect the start of the processing of the object task is to be processed in parallel to the processing of the other task, the control processor unit (103) determines the control data so as to raise the threshold voltage of the SOI/MOS transistors and lower the clock signal frequency with respect to the internal circuit of the processor unit that processes the different task so as not to end the different task processing after the other task processing. If the different task processing is ended before the other task processing, the reason why the other task processing is speeded up is still effective. Consequently, slowing-down of the different task processing so as not disturb the ending of the other task processing can reduce the system power consumption effectively.

[6] In another aspect, the multiprocessor system includes plural processor units that can operate in parallel and a body-bias control circuit. Each of the processor units includes an internal circuit composed of silicon-on-insulator structured SOI/MOS transistors having a back gate isolated electrically from other MOS transistors respectively and is synchronized with a clock signal in operation. The body-bias control circuit outputs a body-bias voltage to the back gate of each SOI/MOS transistor of the internal circuit. In this configuration, one of the processor units executes a scheduler (300) to make task scheduling by taking consideration to the dependency among tasks so as to enable the plurality of processor units to process plural tasks in parallel. Each of the other processor units executes a task manager (301) to refer to the result of the task scheduling to control the processing of its object task (task execution management). The one processor unit, upon making the task scheduling, generates control data used to control the body-bias voltage and the clock signal frequency for each task and determines the control data so as to reduce the processing time of each of other tasks that might affect the start of the processing of one object task. In this example, the one processor unit functions as the control processor unit described in [1]. This is why the multiprocessor system can realize the reduction of both task processing time and power consumption in its multitask processings just like the multiprocessor system described above.

[7] In the multiprocessor system described in [6], the one processor unit, upon making the task scheduling, registers each scheduled task and its corresponding control data in a queuing table prepared for each processor unit. Each of the other processor units refers to the corresponding queuing table in the task execution management process to obtain an object task and its corresponding control information.

[8] In the multiprocessor system described in [7], the one processor unit, upon making the task scheduling, determines the control data so as to reduce the threshold voltage of the SOI/MOS transistors and raise the clock signal frequency with respect to the internal circuit of the processor unit that processes the other task.

[9] In the multiprocessor system described in [7], if the one object task is processed after the completion of the other task processing, the one processor unit, upon making the task scheduling, determines the control data so as to reduce the threshold voltage of the SOI/MOS transistors and raise the clock signal frequency with respect to the internal circuit of the processor unit that processes the other task.

[10] In the multiprocessor system described in [9], if a different task that might affect the start of the processing of the one object task is to be processed in parallel to the processing of the other task, the one processor unit, upon making the task scheduling, determines the control data so as to raise the threshold voltage of the SOI/MOS transistors and lower the clock signal frequency with respect to the internal circuit of the processor unit that processes the different task so as not to end the different task processing after the other task processing.

[11] In the multiprocessor system described in [1], the silicon-on-insulator structure is a fully-depleted one. The structure is more effective to control the threshold voltage and suppress the current leak than the partially-depleted one.

[12] In the multiprocessor system described in [11], each of the SOI/MOS transistors includes a first semiconductor layer formed on a semiconductor substrate through a buried oxide film; source and drain regions formed in the first semiconductor layer and having the same thickness of as that of the first semiconductor layer; a channel region formed between the source and drain regions; a first gate formed at the first main face side of the channel region; and a second gate made of a conductive layer formed in adjacent to the bottom face of the buried oxide film. The second gate is the back gate electrode.

[13] The multiprocessor system described in [12] is formed on one semiconductor substrate in the form of SoC.

2. Details of the Embodiment

Next, there will be described the details of the embodiment.
<Multiprocessor System>
FIG. 1 shows a block diagram of the multiprocessor system of the present invention. A CMP 100 shown in FIG. 1 is formed on one semiconductor substrate made of, for example, single crystal silicon, according to a known complementary SOI/MOS integrated circuit manufacturing technique, although it is not limited specially. The CMP 100 has a so-called SoC structure.

The CMP 100 includes plural processor units (PU) 101; plural body-bias control circuits (BGCTL) 102; a control processor (CTLP) 103; and a common memory (CSM) 104. Each PU 101 is connected to the CSM 104 and the CTLP 103 commonly through an interconnection network (BUS) 105.

Although not shown here, each PU 101 includes a CPU that fetches and executes instructions, a clock generation circuit that controls the frequency of the synchronous operation clock of the CPU, etc. Each CMOS transistor of each PU 101 is, for example, an FD-SOI/MOS transistor. The body-bias generation circuit (BGCTL) 102 generates a body-bias voltage to be applied to the back gate of each FD-SOI/MOS transistor of each PU 101. The control processor (CTLP) 103 executes a task scheduler program (scheduler) to make task scheduling among tasks to be processed by plural PUs 101. The control processor (CTLP) also controls resource management. The resource management mentioned here means controlling the generation of control data used to control the body-bias voltage and the clock signal frequency for each PU upon task scheduling. As to be described in detail later, the control data is determined upon starting the processing of one object task so as to reduce the processing time of the other task that might affect the start of the processing of the object task.

Although not limited specially, each PU 101 includes a cache memory and a local memory used to cover up the time of accesses to the CPU, as well as accesses to the CSM 104. The body-bias control circuit 102 applies the body-bias voltage BGP/BGN to the back gate of each FD-SOI/MOS transistor in the corresponding PU 101 according to the body-bias control signal 110 output from the CYLP 103. As to be described later, the control data generated upon task scheduling is registered together with the corresponding task ID in the task queuing table. The PU that executes the registered task passes the control data to the CTLP 103, thereby the corresponding body-bias control circuit 102 generates the body-bias voltage according to the body-bias control signal 110.

The clock signal generation circuit of each PU 101 determines the clock signal frequency according to the state of the body-bias voltage. When lowering the threshold voltage of the MOS transistors, the body-bias voltage functions to raise the clock signal frequency and when raising the threshold voltage, the body-bias voltage functions to lower the clock signal frequency. A PU that executes a task registered in the task queuing table may control the clock signal frequency with use of the control data corresponding to the task. Although not limited specially, each PU 101 may include a power control circuit that controls the power supply, for example, changing the supply voltage according to the clock signal frequency and turning off the power supply in the idle state.

In the example shown in FIG. 1, all the processor units (PU) 101 are the same in configuration. The homogeneous multiprocessor configuration in which, for example, plural general processors are connected to each another is employed for those processor units. The configuration may also be formed so that some of the processor units (PU) are signal processing processors (DSP) and dynamically reconfigurable processors (DRP). What is essential here is that the types and number of processor units (PU) are not limited only to those shown in FIG. 1; they may be changed as needed.

Figure 2:
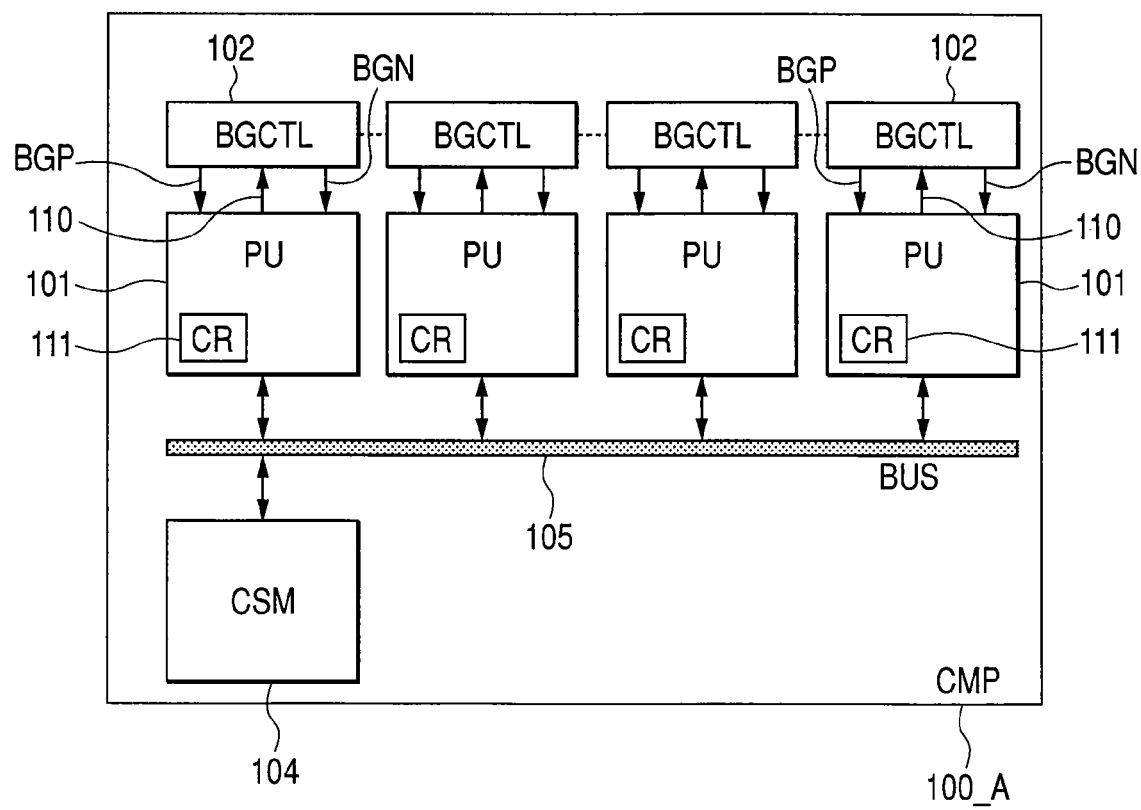
FIG. 2 is a block diagram of another example of the multiprocessor system of the present invention.

FIG. 2 shows another example of the multiprocessor system. A CMP 100_A shown in FIG. 2 does not include the control processor (CTLP). The task scheduling function of the control processor (CTLP) 103 is executed by one of the processor units (PU) 101. The body-bias control function of the control processor (CTLP) 103 is executed by each PU; concretely, the control register (CR) 111 of each PU controls the BGCTL 102. The CR address is mapped in a memory space. Upon making task scheduling, one PU that executes the scheduler program for assigning tasks (task scheduling) and managing the system power supply generates the control data as described above. And each PU 101 that executes a registered task passes the control data to the corresponding CR 111, thereby the corresponding body-bias control circuit 102 generates a body-bias voltage according to the body-bias control signal 110. Other items in the configuration are the same as those shown in FIG. 1, so that the description for them will be omitted here, avoiding redundant description.

Figure 3:
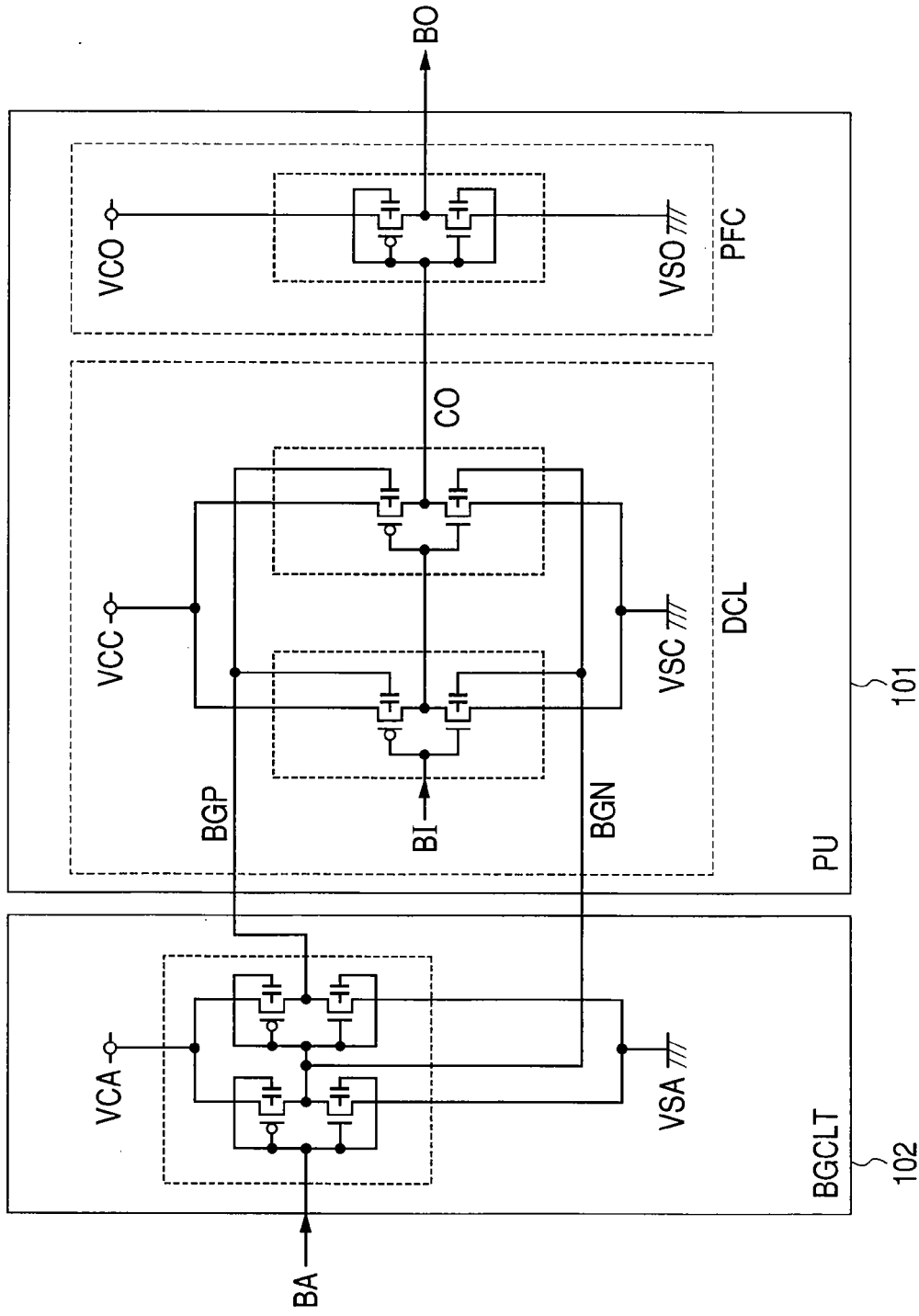
FIG. 3 is a circuit diagram that shows part of an internal circuit and a body-bias control circuit of the multiprocessor system of the present invention.

FIG. 3 shows a circuit diagram of part of the internal circuit and the body-bias control circuit 102 of a processor unit 101. The DCL is a logic circuit block shown as an object circuit of which body-bias is to be controlled. The PFC is a driver circuit shown as a circuit that drives an output terminal BO1 having a large load. All the MOS transistors shown in FIG. 3 are premised to be FD-SOI/MOS transistors. The DCL is formed with inverter circuits disposed in two stages as an example here. An input to this block is BI and an output thereto is CO. The supply voltage is VCC and the ground voltage is VSC. The body-bias voltage applied to the p-channel type FD-SOI/MOS transistors in the DCL is BGP and that applied to the n-channel type FD-SOI/MOS transistors in the DCL is BGN. The BGCLT 102 outputs one of body-bias voltage levels BGP and BGN in accordance with an input signal BA. The VCA and VSA are operation power supplies for the body-bias control circuit 102 and those supply voltages may be the same as or differ from the supply voltages VCC and VSC applied to each circuit to be subjected to the body-bias controlling. For example, in case of the layout of an LSI chip, a power wiring from a pad connected to an external power supply may be required for each of the VCA and VCC separately. Although the VSC and VSA are described as ground voltages above, those may be different voltages. Those VSC and VSA may also be negative voltages depending on the body-bias controlling mode. Furthermore, the control circuit 102 may be configured so as to change the voltage value continuously according to the mode. The voltage may also be changed by an external power supply circuit provided outside the chip. In this embodiment, it is possible to change the state of the threshold voltage of the nMOS and pMOS transistors in the DCL. Therefore, according to the state of the DCL operation, the threshold voltage in the DCL can be selected properly. Upon speeding up the operation, therefore, it is possible to set a lower threshold voltage with an absolute value and upon slowing down or in the stand-by state, the threshold value can be set higher to suppress the leakage current. In such a way, this embodiment can realize both fast operations and power reduction. The input signal BA is a single bit signal corresponding to the body-bias control signal 110 output from the CTLP 103 shown in FIG. 1 or it is assumed to be the body-bias control signal 110 output according to the set value of the CR 111 shown in FIG. 2. In this embodiment, the level of the signal BA is controlled according to each task processing, thereby the body-bias voltage can be changed properly. As a result, in case of the low or standard operation speed of the DCL, the leakage current can be reduced by applying the body-bias voltage in the negative direction, thereby raising the voltage. In case of the fast speed operation of the DCL, the body-bias voltage is applied in the positive direction, thereby lowering the voltage and increasing the driving current to enable fast switching operations of transistors. Connection of the gate electrode of a transistor to the back gate thereof is specific only to the FD-SOI/MOS transistors. This connection form is also referred to as the self-restrained body-bias control, which lowers the threshold voltage while the subject transistor is turned on, thereby speeding up its switching operation. This is because the transistor has a MOS device structure in which the leakage current to the semiconductor substrate is suppressed.

<Effects of Body-Bias Voltage Changes>

Next, there will be described the effects of the body-bias voltage applying with reference to the transistor driving current characteristics.

Figure 4A:
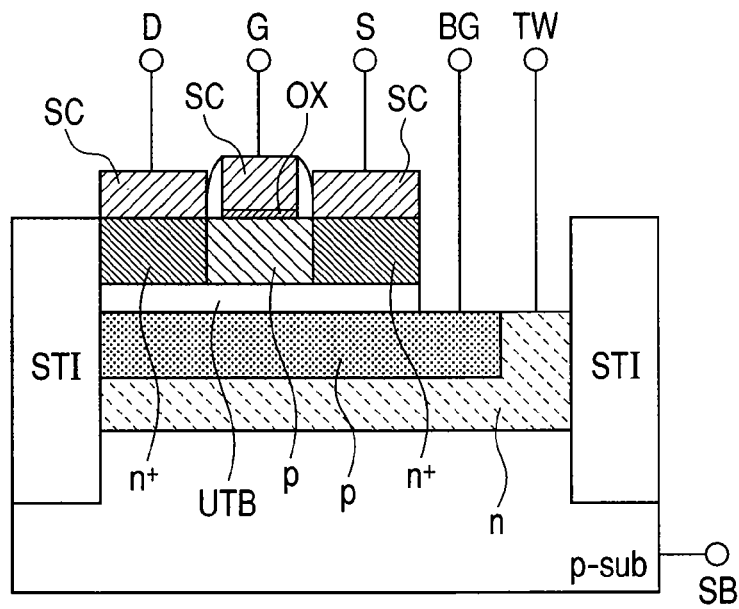
FIG. 4 is a diagram that describes a vertical cross sectional structure and body-bias characteristics of a SOI/MOS transistor.

FIG. 4A shows a vertical cross sectional view of an n-channel SOI/MOS transistor. This SOI/MOS transistor is formed on a p-sub (p-type substrate) having a terminal SB and in a region insulated electrically from the adjacent transistors and from the substrate respectively by a trench isolation region ST1 and a buried oxide film UTB. The UTB is 10 to 20 nm in thickness. The S, G, and D are a source terminal, a gate terminal, and a drain terminal respectively. Those terminals are connected to the n+ region (source), p region (channel forming region), and n+ region (drain) respectively. Those terminals are about 20 nm in thickness respectively. An oxide film ox is formed between the gate SC and the p-region to obtain a so-called MOS structure. Under the UTB is formed a p-region connected to the terminal BG, as well as an n-region that has a terminal TW and isolates the p-region from the substrate electrically. According to this configuration, the BG is connected to its object through the p-region; the UTB functions as an insulator here. It would thus be understood that if the UTB is assumed as a second gate oxide film, a second gate comes to exist at the back side of the MOS structure.

Figure 4B:
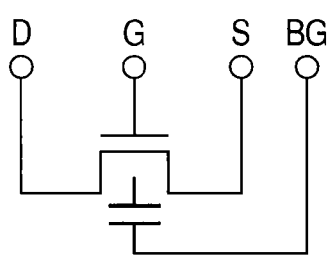

It would be understood that this configuration makes it easier to control the threshold voltage of each transistor than the bulk structure in which the above-described silicon-on-insulator-structured MOS transistors are isolated from each another by a well. The SOI/MOS transistors can be configured as fully-depleted ones having a silicon layer n+ assumed as a channel forming region and a source/drain and having a thin P film formed on a buried oxide film respectively or as partially-depleted ones having a thick P film. For example, in the 0.2 μm process, the former film thickness is usually as extremely thin as about 50 nm or under. Consequently, the device process of the former becomes more difficult than that of the latter. However, the influence of the gate voltage to be exerted on the charge of the inverted layer in the channel region becomes more dominant than the partially-depleted silicon-on-insulator structure. Thus the threshold voltage characteristics become more favorable and it is easier to set a static noise margin as to be described later. The partially-depleted film thickness in the 0.2 μm process is about 100 to 200 nm. FIG. 4B shows circuit symbols for the structure shown in FIG. 4A.

Figure 4C:
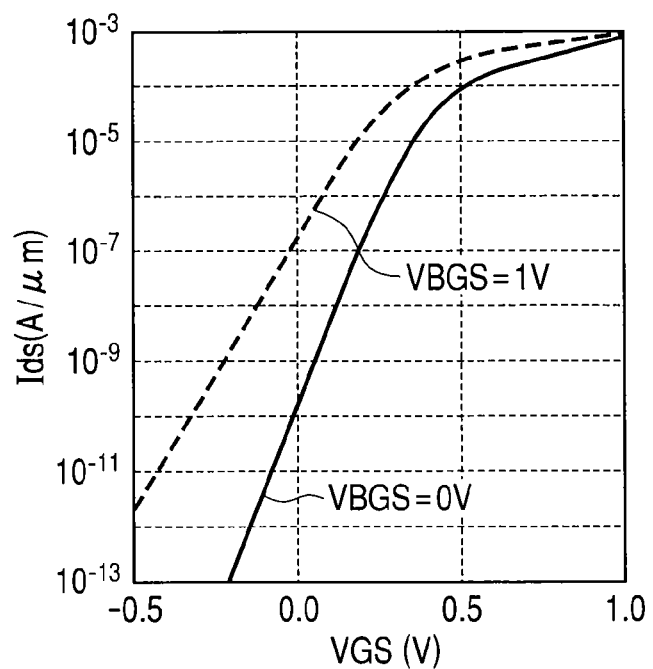

FIG. 4C is a diagram that describes the ID-VGS characteristics assumed when the body-bias voltage VBGS is 1 V or 0 V in an n-channel type FD-SOI/MOS transistor. In FIG. 4C, if the body-bias voltage is applied in the positive direction (VBGS=1 V), the driving current increases when the transistor is turned on at VGS>0.5 V. If the body-bias voltage is applied in the negative direction (VBGS=0 V), the off current, that is, the leakage current decreases when the transistor is turned off at VGS=0 V.

<Scheduler>

Next, there will be described an operation flow of the scheduler. The scheduler assigns tasks to plural PUs 101 so that the whole task execution time is reduced as much as possible according to how divided tasks are processed by those PUs. The user may divide and define each input task clearly. Furthermore, a compiler as to be described later may divide and define the input task mechanically with use of a program structure such as a sub-routine, loop, etc. The task unit grain mentioned here may be a partial program unit divided in a program that realizes a function or it may be one of the programs that realize plural functions. A term "task" is often replaced with a thread or process.

<Task Table>

The relationship among tasks, inputted by the scheduler is defined beforehand by the user or with use of a tool or the like. FIG. 5 shows a task dependency table (scheduling table) denoting such a relationship among tasks. The scheduling table includes fields of task number (ID), dependent task number (ID), processing time, priority, target PU, and shared data size with respect to each task. Each field means as follows. The task number is a fixed number (ID) of each task assigned upon executing a program and it is a unique task number. The task numbers handled in the scheduler are generated automatically in the scheduler, so that they are not always the same as those handled in the scheduler.

The dependent task number (ID) denotes the number of a task to be processed in prior to the object task so as to enable the processing of the object task. This means that output data generated by executing a task specified with this dependent task number (ID) is used as input data of the object task (data dependency) or a branch processing is included in the dependent task and the next task to be activated according to the result of the executed branch processing is assumed as the object task (control dependency). The processing time denotes a processing time of the object task executed in a PU 101 of the target CMP 100. The unit of this processing time is the number of cycles or a predetermined unit time. This processing time may be a real processing time of each object task executed in a single PU 101. This processing time may also be an execution time estimated from a generated instruction code with use of such a tool as a compiler. In this embodiment, a processing time estimated with use of a compiler is denoted in kilocycles.

The priority denotes an index value used upon selecting a task to be assigned with temporal priority from among plural tasks to be assigned and executed. Various indexes are used to set this priority. For example, the user may specify this priority. A higher priority level is given to an object task upon designing an application program if the execution of the task with temporal priority is expected to reduce the whole program execution time. A higher priority level is also given to a cyclical task or the like that has less time to spare. Such a higher priority level is also given to an interruption processing task so as to minimize the influence of the task execution to be exerted on other ordinary processing tasks. Such a tool as a compiler can be used to set those priority levels. For example, in a process for creating a task graph denoting a relationship of dependency among tasks generated with use of a compiler, each task execution time is estimated and the longest execution time path (critical path) is found from among those of the left-over tasks according to the relationship of dependency among those tasks. Then, high priority levels are given to the tasks on the critical path and low priority levels are given to the tasks on non-critical paths. This is to enable each task that might affect the whole processing time to be processed preferentially and the whole execution time to be optimized. Consequently, the priority may be set according to the processing time of the object left-over task. Furthermore, the priority may be used as a flag to specify a task of which processing is to be speeded up through the body-bias controlling.

The target processor field denotes a PU 101 suitable for processing the object task. The PU 101 is assumed to be included in the heterogeneous configuration in which a PU 101 of the CMP 100 is dedicated to such specific fast processings as those of the signal processing processor DSP, etc. In this example, the target processor is configured as a homogeneous CMP, so that a general processor unit is assumed as the target processor. In FIG. 5, this general processor unit is shown as a CPU.

The shared data size denotes a size of data exchanged by a dependent task and an object task when there is data dependency between those tasks. This means that the shared data size denotes a size of data generated by a dependent task and used by an object task or data used by both the dependent and object tasks. When assigning an object task, the task is assigned to the PU 101 that has executed a task having a large shared data size, thereby the data read into a cache upon processing a dependent task or the data transferred beforehand to a local memory comes to be utilized by the object task in maximum. As a result, the size of the data to be transferred to such a necessary external memory as the CSM 104 can be reduced significantly, thereby the transfer time can be reduced upon executing the object task. When such data is stored in a local memory, however, it is necessary to determine a fixed address for the data beforehand. Such a data address is specified clearly in the subject program or with use of such a tool such as a compiler.

<Concept of Power Control>

Next, there will be described some power controlling methods employed for task scheduling through body-bias controlling. The first method uses the priority defined in the scheduling table. The priority is set by the user or with use of such a tool as a compiler. And upon processing a task according to a predetermined priority level or over, the body-bias controlling is made (forward body-bias) for the PU 101 that executes the object task to lower the threshold voltage (reduce the gate-source) and raise the speed of the PU 101 to process the task, thereby reducing the whole processing time. For the tasks with priority levels under the predetermined one, body-bias controlling is made in the backward direction for the UP 101 that executes the object task, thereby raising the threshold voltage (raise the gate-source voltage) and slowing down the speed of the PU 101. As a result, the influence of the task processing time to be exerted on the whole processing time is reduced, thereby the system power consumption is reduced. For example, upon executing a task group as defined in the scheduling table shown in FIG. 5, body-bias controlling is made in the forward direction for the PU 101 that executes tasks of which priority levels are 5 or over.

The second controlling method makes body-bias controlling for each PU 101 so as to reduce the unbalance of the throughput among PUs in parallel operations (so as to reduce the unbalance of the processing speed or performance) by utilizing the unbalanced throughput among those PUs, which is generated from a relationship of dependency among tasks upon task scheduling for those PUs 101.

Figure 6A:
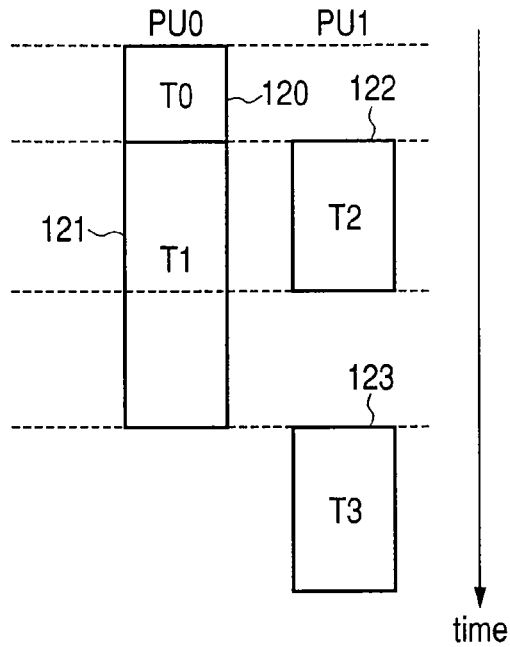
FIG. 6 is a diagram that describes a power control method.
Figure 6B:
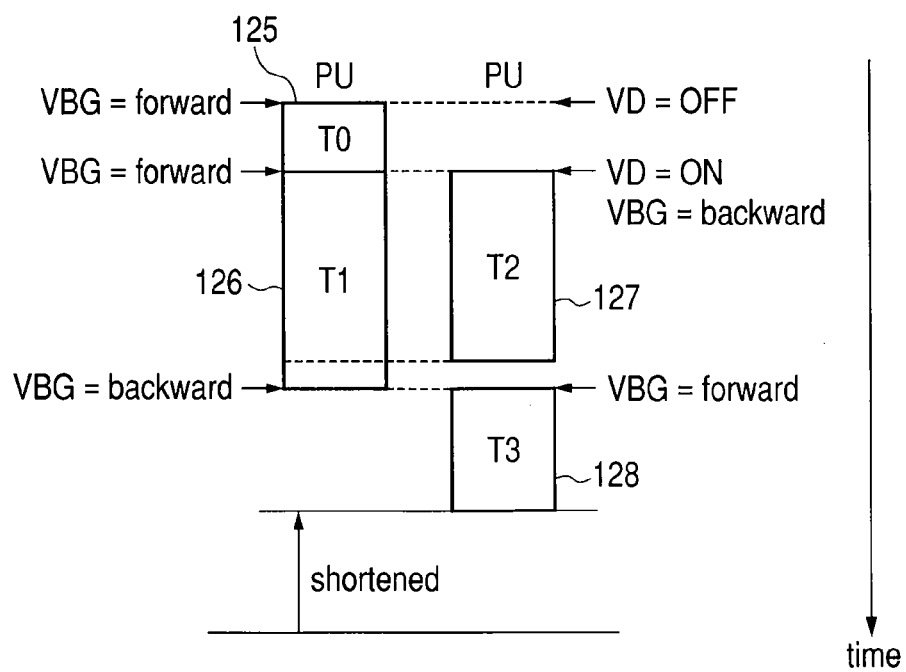

FIG. 6 shows a concept of the controlling by the second method. In FIG. 6, it is premised that tasks shown in the scheduling table in FIG. 5 are assigned to two PUs PU_0 and PU_1. FIG. 6A shows the states of those PUs before body-bias controlling is made and FIG. 6B shows the states of those PUs after the body-bias controlling is made. Each broken line denotes a scheduling point at which the scheduler operates. According to the information in the scheduling table, the initial task T0 is assigned. At this time, both PU_0 and PU_1 are idle. Thus the task T0 is assigned to PU_0. At this time, the tasks T1 and T2 regard T0 as a dependent task. And unless the dependency is eliminated, that is, unless the T0 processing is ended, the next task cannot be executed. Upon assigning the T0, therefore, the scheduler executes body-bias controlling (forward body-bias) for the processor PU_0 that executes the T0 to lower the threshold voltage and to raise the speed of the T0 processing, thereby quickening the start of the processings of T1 and T2. Furthermore, the scheduler turns off the supply voltage of the PU_1 that is idle while the T0 is processed or executes backward body-bias controlling to raise the threshold voltage, thereby suppressing the power consumption and reducing the whole processing time more than a case in which no body-bias controlling is made. In FIG. 6, VBG=forward means applying a bias voltage in the forward direction and VBG=backward means applying the bias voltage in the backward direction. VD=OFF means power supply off and VD=ON means power supply on. Numerals 120 to 128 mean task processings respectively.

After this, the scheduler receives a notice of completion of T0 execution, then selects T1 and T2 as executable tasks (ready tasks). Then, according to the information in the table, T3 regards both T1 and T2 as dependent tasks; T3 cannot be executed until both T1 and T2 processings are completed. The processing times of T1 and T2 are 30K cycles and 15K cycles respectively. Thus the scheduler refers to the scheduling table and detects that T1 and T2 can be executed in parallel in two PUs PU_0 and PU_1 of which processing times are different from each other. Then, the scheduler makes body-bias controlling (forward body-bias) for the PU_0 that executes the T1 having a large cost (the longer the execution time is and the higher the priority level is, the higher the task cost becomes) to raise the speed of the PU_0 and quicken the start of the processing of the T3, thereby the whole program execution speed is raised. On the other hand, if possible, body-bias controlling (backward body-bias) is made for the PU_1 that executes the T2 having a small cost so as not to disturb the start of the processing of the T3, thereby the processing of the PU_1 slows down and the influence of the processing time to be exerted on the whole processing time is suppressed. As a result, the system power consumption is reduced. After completing the processings of both T2 and T3, the scheduler selects the task T3 of which dependency is eliminated. The scheduler speeds up the processing of T3 by assigning T3 to PU_1 that has executed T2 which is a dependent task of T3 and has a large shared data size if T3 is not a dependent task for any tasks and there are no tasks to be processed in parallel.

<Scheduler Operation Flow>

Figure 7:
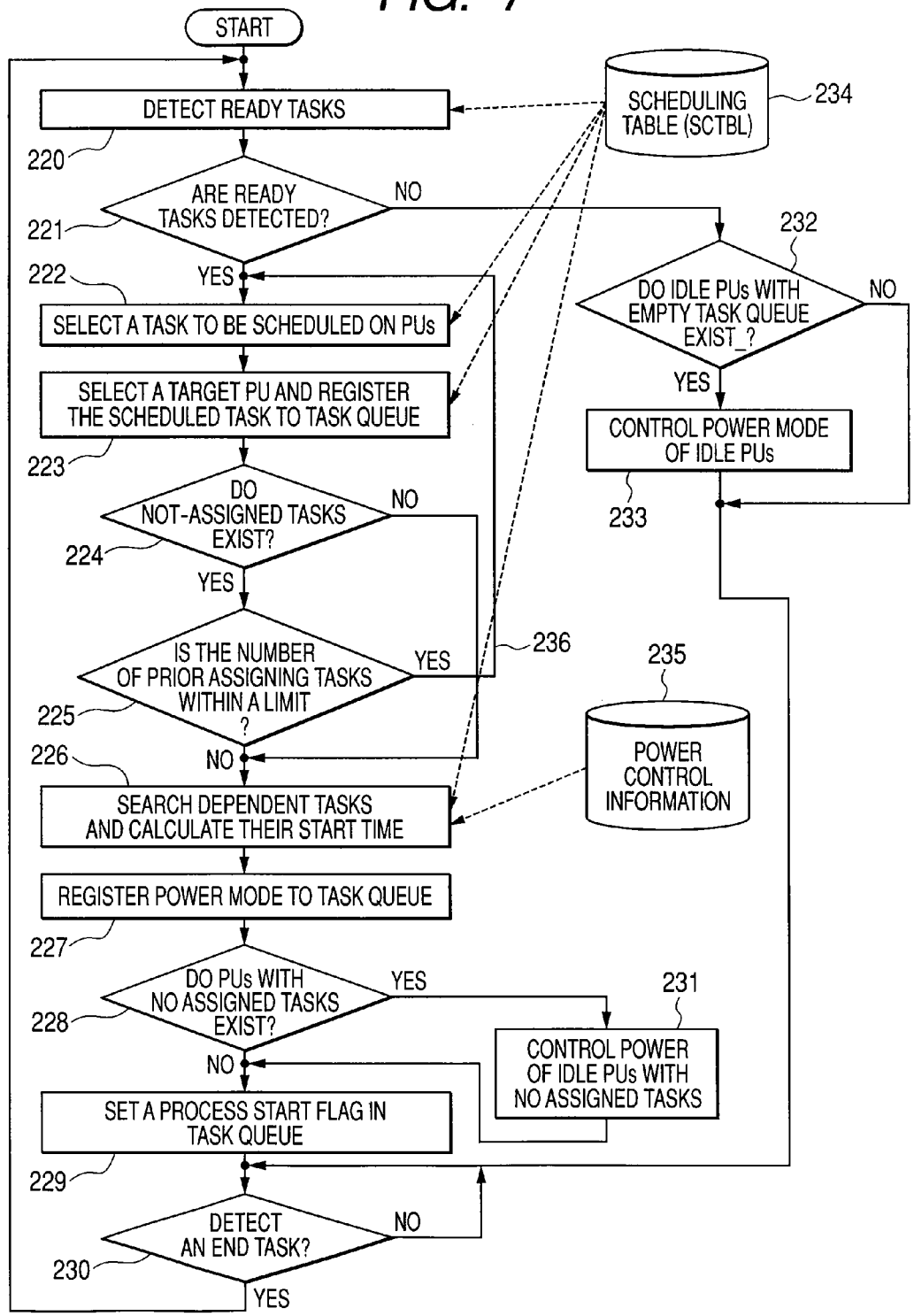
FIG. 7 is an operation flowchart of a scheduler.

FIG. 7 shows an operation flowchart of the scheduler. At first, the scheduler refers to the scheduling table (SCTBL) as shown in FIG. 5 to detect ready tasks at that time (220). Ready tasks are tasks for which data dependency and control dependency are eliminated when a task processing is completed or when the scheduler is activated. When the program is started up, a task executable in the initial state is selected. If the task data is used by plural succeeding tasks, those tasks may be assumed as ready tasks. If there is no ready task as a result of the detection, the task scheduling step is omitted and a check is made for the existence of processor units in the idle state (232). Concretely, whether or not any task is idle is confirmed by checking whether or not there is any task registered in a task queuing table prepared for each PU 101. If all the tasks in this task queue are already processed by the subject PU and the PU is idle, the PU power supply is turned off. Then, the scheduler executes, for example, body-bias controlling (backward body-bias) to reduce the power of each idle PU (233). After this, the scheduler repeats the detection of processed tasks.

If the scheduler detects a ready task, the scheduler then refers to the scheduling table 234 to select the top priority task as an object task to be assigned to a PU (222). The priority level is as described above with respect to the configuration of the scheduling table. If such a priority level is related to the number of left-over tasks at the viewpoint from the object task and if a priority level is set in proportion to an increase of the number of those left-over tasks, higher priority tasks (there are many left-over tasks) among ready tasks are assigned to PUs earlier, thereby the whole program execution time is optimized (reduced).

Figures 9, 10:
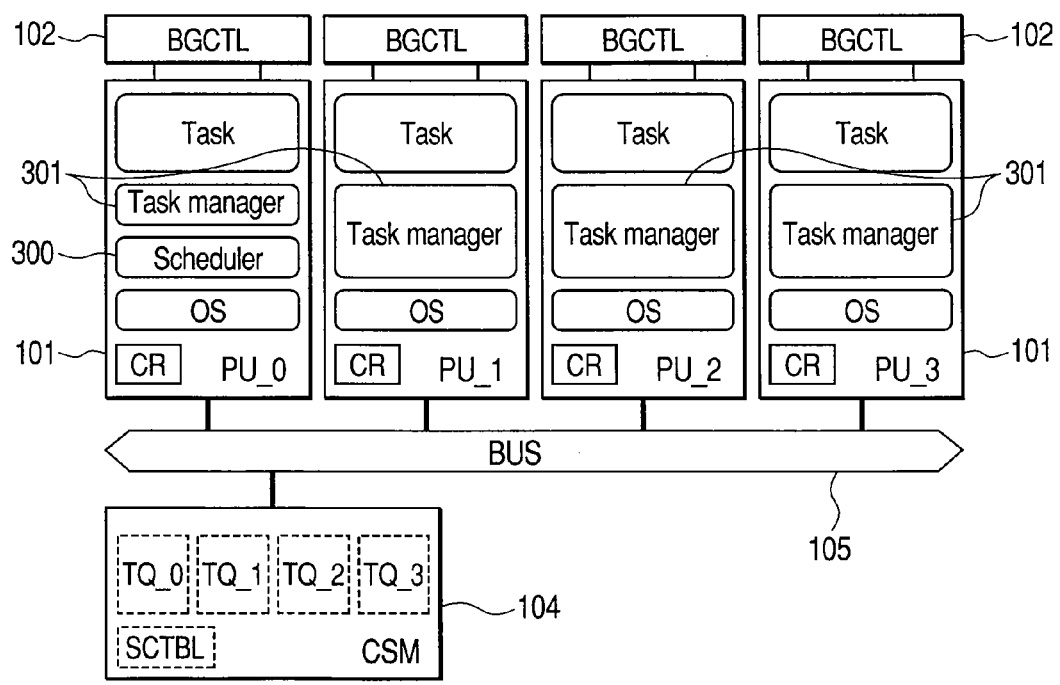
FIG. 9 is a configuration of a task queue used by the task manager.
FIG. 10 is a diagram that describes an example of how the task manager executes processings.

After this, the scheduler determines a PU that will process the object task (223). If there is any task that is already assigned to a PU, the scheduler assigns the object task to the PU 101 that will complete the assigned task earlier so that the object task is processed just after the already assigned task. The task assignment to the PU 101 is made by adding an entry to the task queue (task queuing table) that manages the task execution in the target PU 101. FIG. 9 shows the entry items of the task queue. The entry items are task ID, power mode, finish time, and status. The power mode is determined in the succeeding processing. The finish time uses the processing time of the object task defined in the scheduling table. If there is any already assigned task, the processing time is added to the field of the task finish time to obtain this finish time. The status is assumed to be "Assigning" in this processing, since the power mode is not determined.

After this, if detecting plural ready tasks, the scheduler checks whether or not there is any ready tasks that are not assigned yet (224). If there is no ready task, control goes to the next power control processing. If there is any ready task, the scheduler assigns the task to a PU (hereinafter, such task assignment is referred to preceding task assignment). This is because a ready task can be executed any time and its scheduling can be made, so that a group of ready tasks can be assigned to plural PUs at a time. As a result, the scheduling overheads are reduced. If many preceding tasks are assigned, however, the number of processors might be insufficient at the time of scheduling, thereby execution of high priority level tasks might be disturbed. In order to avoid this problem, the scheduler checks whether or not the number of preceding tasks specified beforehand is within a predetermined limit (225). If the number of such tasks is within the limit, the scheduler repeats the task assignment procedure again (236). If the number of such tasks has reached the limit, the scheduler goes to the power control processing immediately.

Finishing assignment of all the object tasks, the scheduler searches independent tasks executable after the completion of the assigned tasks (group) and calculates the starting time for those tasks with use of the processing time information (226). If there are plural tasks executable at a time after completing the processings of the plurality of independent tasks, that is, object tasks (group), the scheduler calculates the starting time for each of those tasks. The result of this processing is used in the succeeding power control processing. If the power control processing is carried out with use of a method that determines a power mode uniquely according to the priority information, this processing (226) is not carried out, since the independent task starting time is not required.

After that, the scheduler carries out the power control processing (body-bias control) and registers the power mode in the task queue (227). The power control procedure differs between the above-described two control methods. If the first priority information is used to determine the power mode uniquely (first method), power control information 235 is defined beforehand so that the priority level and the object power control mode are related to each other. Then, the scheduler determines the power mode according to the priority information. Then, the scheduler writes the determined power mode in an entry having the corresponding task ID in the task queue table. Next, there will be described a case in which the second method is used to reduce the unbalance of the throughput among the PUs according to the result of the parallel scheduling. At first, according to the starting time of the independent task found as a result of the processing (226), the scheduler checks whether or not the starting time of the independent task (power control employment standard) changes when the object task execution time is changed due to the power control execution. If the starting time of any of the independent tasks is quickened due to the forward body-bias application to speed up the PU operation, the scheduler determines power control execution for the object task (forward body-bias) and sets "Low-Vt" for the power mode corresponding to the object task in the task table. On the other hand, if the starting time of the independent task makes no change even upon extending the execution time by the backward body-bias applying, the scheduler determines power control execution (backward body-bias) for the object task and sets "High-Vt" for the power mode of the object task in the task table. If there is no independent task, the scheduler uses the finishing time of the task of which ending is the latest among the assigned tasks as the standard of judgment whether to execute the power controlling.

Completing the power control processing 227, the scheduler checks whether or not there is still any non-allocated PU (228). Concretely, the scheduler checks whether or not there is any entry in the task queue prepared for each PU to make this judgment. If there is any non-allocated PU, it means that there is no task to be processed. Thus the scheduler executes power controlling (231) to reduce the system power consumption. After this, the scheduler sets "Assigned" for the status in the task queue (229). Each PU 101 therefore takes out an execution task and begins the execution. The scheduler then waits for a finish notice (230) from each PU 101. Upon detecting a task finish notice from a PU 101, the scheduler begins the processing 220 to repeat the above processings.

<Task Manager Operation Flow>

Figure 8:
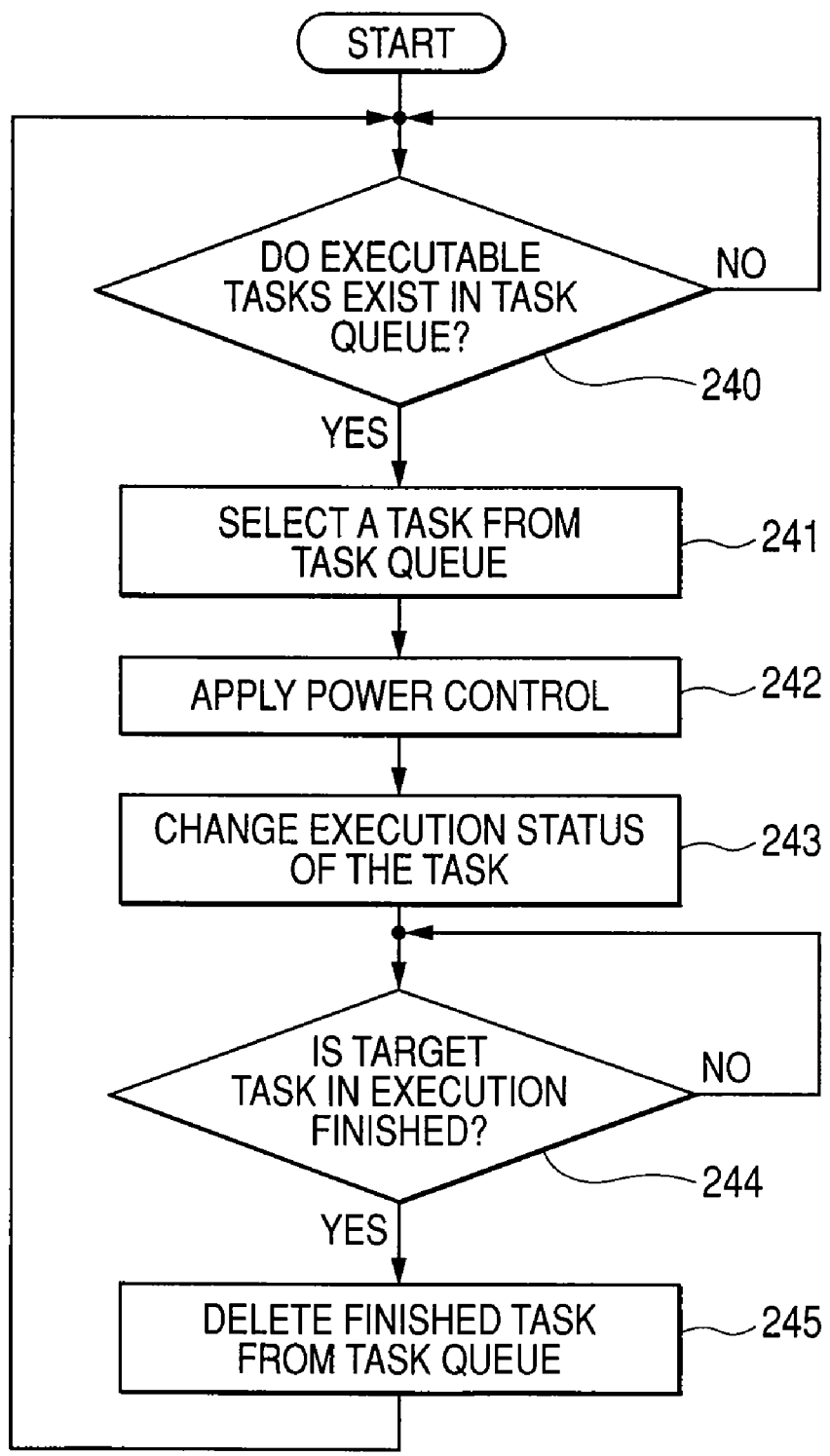
FIG. 8 is an operation flowchart of a task manager.

FIG. 8 shows an operation flowchart of the task manager. Each PU executes the task manager to process its object task according to an entry set in the task queue. The task manager's processing procedure is as follows. At first, the task manager checks the object entry in the task queue as shown in FIG. 9 to check whether or not there is any assigned task in the task queue, that is, there is any task of which status is "Assigned" (240). The task queue is an FIFO (First In First Out) memory and tasks are taken out from the task queue in the order they are assigned (241). The task manager then reads the power control mode in the entry and sets a value in the control register CR or notifies the power control mode to the control processor CTLP (242). After this, the task manager executes the task processing and changes the entry status to "Running" denoting that the task processing is being executed (243). Waiting for the end of the object task execution (244), the task manager detects the end and deletes the task queue entry (245). Then, the task manager detects another assigned task (240). At the end of each task is buried a finish code in the compiling process. The finish code denotes passing of the processing control to the scheduler.

The task manager makes non-preemptive task scheduling without expecting any task change while a task is processed. If a preemptive task change is made by the OS, the task processing by this task manager is suspended temporarily and restarted by an instruction from the OS.

As described above, the task queue prepared for each PU allocated to process an object task holds the object task ID, as well as the control data used to control the power required to process the task, as well as the clock signal frequency. The PU can thus use the control data set in its own task queue to process the object task, thereby plural tasks come to be processed in parallel by satisfying the dependency relationship among the tasks just as scheduled by the scheduler.

<Scheduler Configuration>

Next, there will be described a configuration of the scheduler. The scheduler may take various configurations. FIGS. 10 through 13 show some examples of the scheduler configuration. In FIG. 10, the scheduler 300 runs on the OS of just one PU (PU_0) and the task manager 301 that processes tasks runs on the OS of each PU. Task queues TQ_0 to TQ_3 prepared for the PUs (PU_0 to PU_3) respectively, as well as the scheduling table SCTBL are disposed in the CSM 104.

Figure 11:
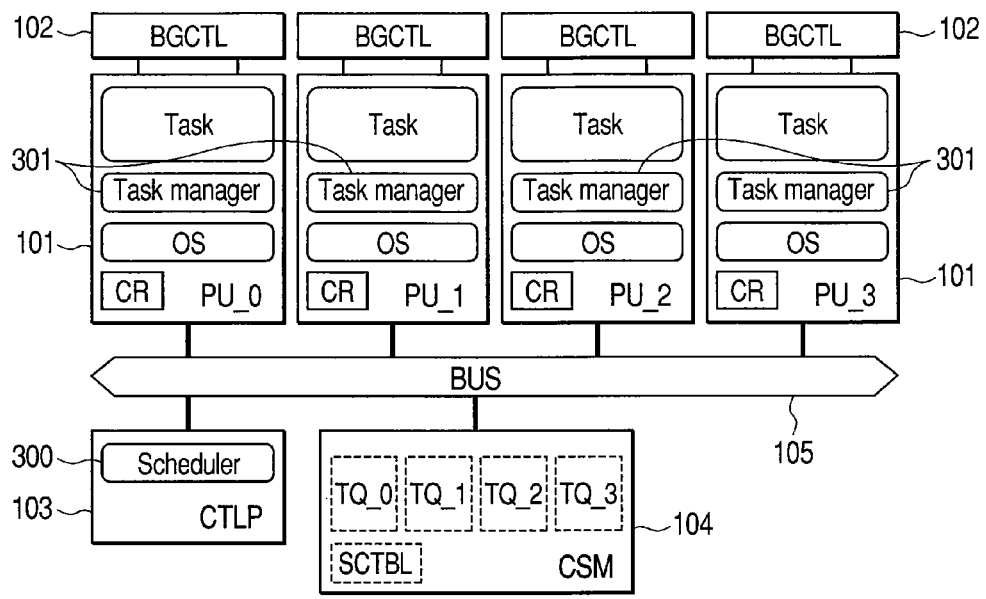
FIG. 11 shows a diagram that describes another example of how the task manager executes processings.
Figure 12:
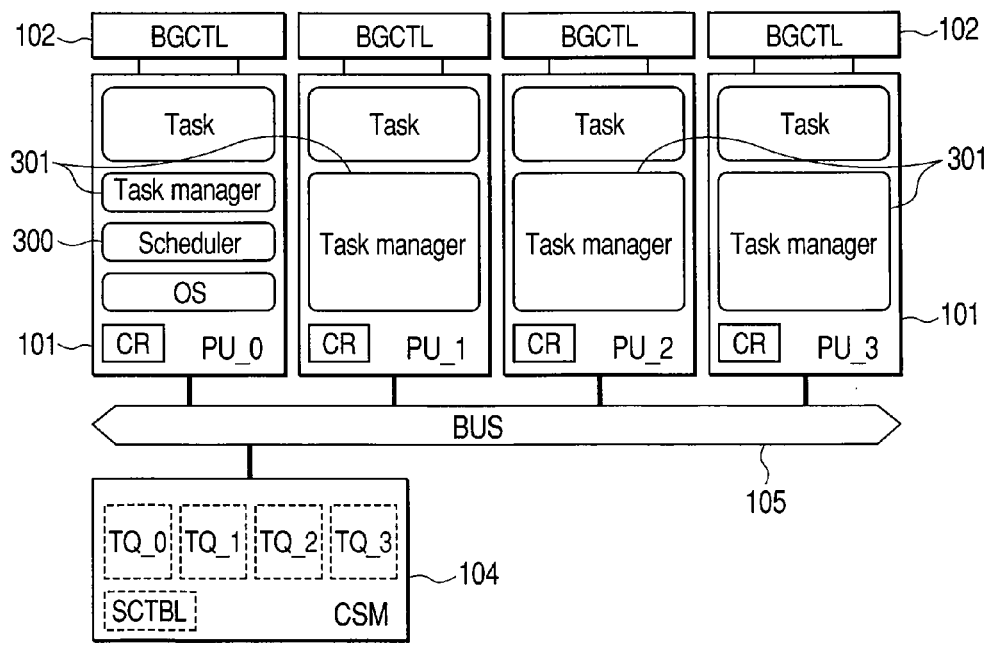
FIG. 12 shows a diagram that describes still another example of how the task manager executes processings.
Figure 13:
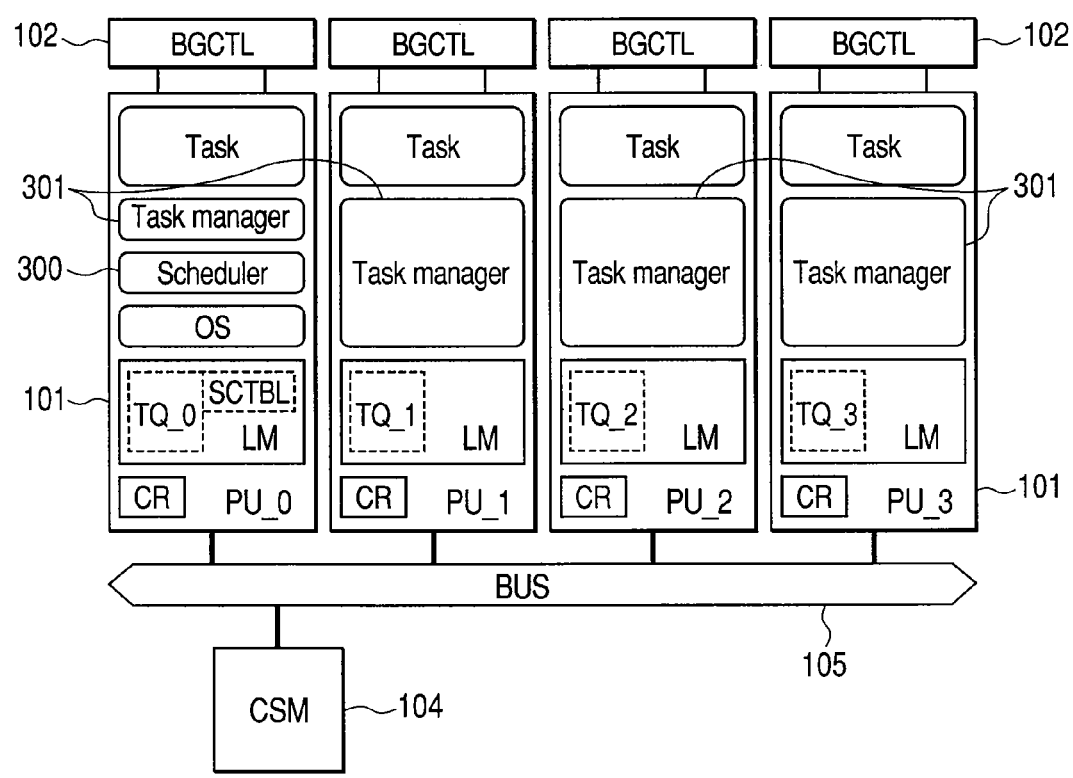
FIG. 13 is a diagram that describes still another example of how the task manager executes processings.

In the configuration shown in FIG. 11, the control processor 103 operates the scheduler 300 and the OS of each PU (PU_0 to PU_3) 101 operates the task manager 301. In the configuration shown in FIG. 12, the OS of the PU_0 operates the scheduler 300 and the task manager 301. However, each of the PU_1 to PU_3 processes tasks under the control of the task manager 300; no OS is provided for any of those PUs. Task queues may be disposed in various areas. In the configuration shown in FIG. 13, the task queues TQ_0 to TQ_3 are disposed in the local memory of each PU 101. The scheduling table SCTBL used for task scheduling is disposed in the local memory of the PU_0. As a result, quick accesses are enabled from the scheduler 300 in the high speed local memory to the scheduling table SCTBL and from the task manager 301 to the task queue TQ. Furthermore, the load of the communications through the BUS 105 can also be reduced. Any of other configurations may also be taken. For example, in one of those configurations, the scheduling table SCTBL and each PU task queue TQ are disposed in the local memory of the PU that executes the scheduler 300. If there is an on-chip shared memory, all of those are disposed in the shared memory.

<Macro Task Generation>

Next, there will be described procedures for dividing a program into tasks automatically, analyzing the parallelization among those divided tasks, and generating a task table. FIG. 14 shows an example of an input program having a sequential structure described with use of such a high rank language as the C, Fortran, or the like. The program analyzes the object program structure and divides the program into three types of large particle tasks (hereunder, to be referred to as macro tasks MT) to generate a repetition block (RB), a sub routine (SB), and a block of pseudo assignment statements (BPA). The RB is the outermost loop in each hierarchical layer. The BPA is a block obtained by fusing plural basic blocks consisting of assignment statements respectively or dividing a basic block.

<Data Dependency/Control Flow Analysis>

After this, the scheduler analyzes the control flow and data dependency among the macro tasks MT divided and generated as described above to extract the order of executing those macro tasks MT. Because the input program is described sequentially, the execution codes are also executed sequentially by an ordinary compiler just like the structure of this program. However, it would be understood that there is often no need to execute those macro tasks MT in the order they are described. In other words, if there is no dependency between macro tasks MT with respect to controlling or data reference, particularly in case of a multiprocessor system, it is important to make scheduling so as to minimize the whole system execution time by assigning plural macro tasks MT to plural PUs 101 and processing those tasks simultaneously or by changing the execution order. And in order to make such task scheduling, it is required to analyze the parallelization among the macro tasks MT. This is why the execution order among those macro tasks MT is extracted by analyzing the data dependency/control flow analysis as a step towards such an analysis.

<Loop Level Parallelization Analysis>

After this, loop levels are parallelized by analyzing the parallelization among medium particle levels of macro tasks (MT). In this loop level parallelization, data dependency among loop iteration units is analyzed to determine whether or not each iteration can be processed independently. If possible, each iteration is assigned to each of plural PUs 101 and a parallelization processing is carried out in those PUs 101. Such parallelization of loops is realized by various methods, for example, by dividing a single loop into plural loops, thereby improving the parallelization among those loops, as well as by fusing plural loops into a single loop, thereby reducing the overheads required to control the loop.

<Processing Cost Analysis>

After this, the number of processing cycles required to execute a macro task MT in each PU 101 is obtained from the directive information added beforehand. The CPU processing cycles can also be obtained by referring to a CPU instruction table provided in an ordinary parallelization compiler. It is also possible to estimate such a CPU processing cost by holding the number of cycles required on such an instruction level as multiplication, addition, etc. beforehand, then referring to the table to estimate the number of sequential processing cycles upon executing a macro task MT in the subject PU 101.

If there is any element for which the cost cannot be determined at the time of compiling, for example, if a macro task MT has a branch, the branch possibility is assumed as 50% to calculate the cost. Furthermore, if there are any loop size and any array size that are not determined yet, various methods may be employed to determine them. For example, the number of loops is determined as a fixed one and an array size is determined as the maximum size assumed when the array is declared.

<Analysis of Parallelization among Macro Tasks=Analysis of Earliest Executable Condition>

Figure 15:
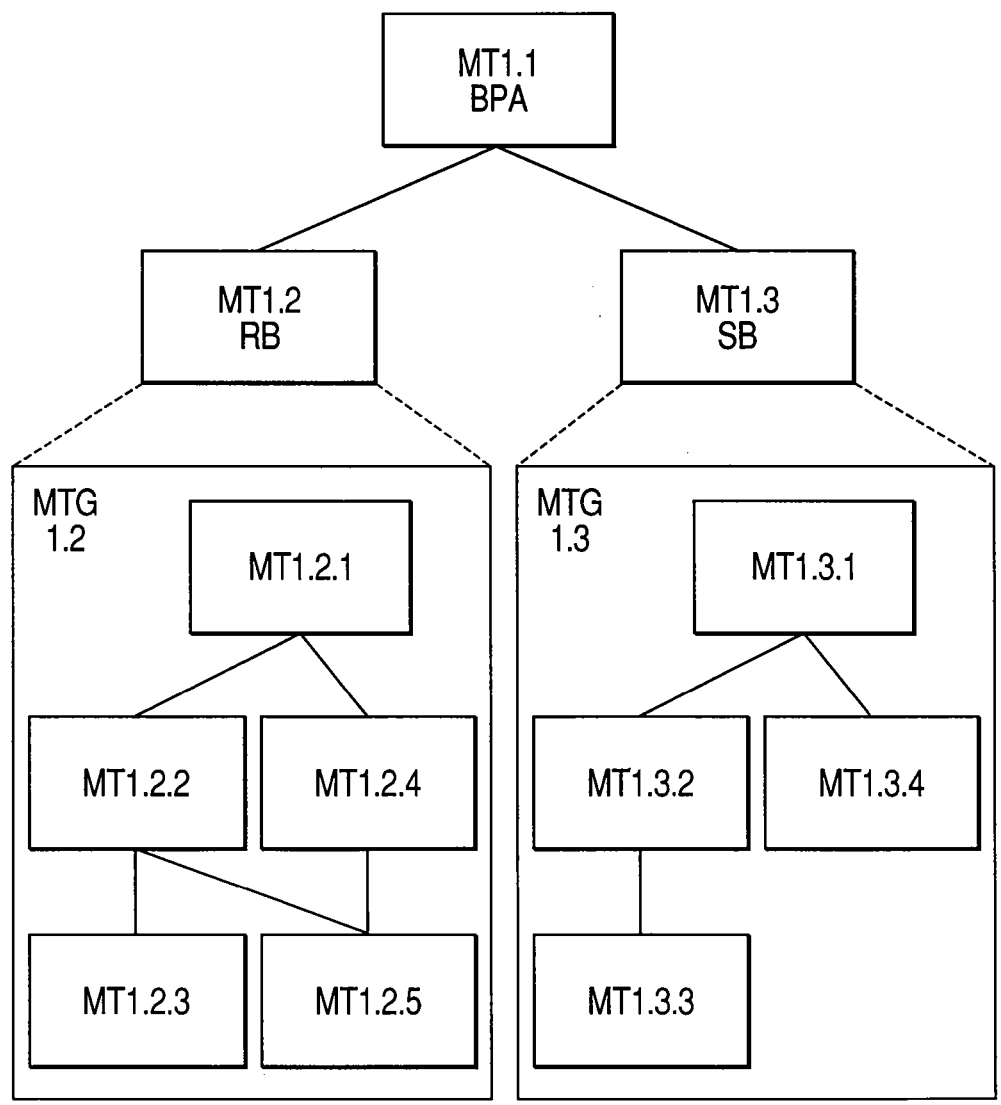
FIG. 15 is a diagram that describes a relationship of dependency among tasks generated by the compiler.

The compiler determines the parallelization among macro tasks MT, that is, the condition for the earliest execution of each macro task MT (the earliest executable condition analysis) from the results of the analyses of both control flow and data dependency among macro tasks MT extracted in the preceding data dependency/control flow analysis after determining the processing cost of macro tasks MT. This earliest executable condition is visualized by a graph. The graph is referred to as a macro task graph (MTG). FIG. 15 shows such an MTG generated as a result of the analysis of the input program shown in FIG. 3. Each node in this graph denotes a macro task MT and the real line between the nodes represents the data dependent relationship between those macro tasks MT. For example, a real line is drawn from the macro task MT1.1 to another macro task MT1.2 (502), then to still another macro task MT1.3 (503). This real line represents a dependent relationship denoting that the macro tasks MT1.2 and MT1.3 use the data generated from the execution of the macro task MT1.1 as input data for their processings. Consequently, the real line denotes that macro tasks MT1.2 and MT1.3 can be executed after the completion of the execution of the macro task MT1.1.

Furthermore, because the macro task MT1.2 (502) is a block consisting of plural loops and sub-routines generated from an input program, the compiler divides the macro task MT1.2 (502) into plural macro tasks MT hierarchically. Thus the MTG comes to be configured in a different hierarchical layer in the macro task MT1.2. So does the MTG1.3 (503) is.

The result of the analysis of parallelization among macro tasks is held in an external memory prepared as a scheduling table and used by the scheduler.

In the multiprocessor system in which plural processor units are integrated while each of the processor units consists of the FD-SOI/MOS transistors as described above, therefore, the efficiency of the processor units for executing tasks respectively is improved and the system power can be controlled with attentive consideration in accordance with the status of each object task execution. In other words, tasks can be processed efficiently at less power consumption while the performance of the multiprocessor system is utilized up to the maximum. As a result, the present invention can apply to semiconductor integrated circuits or semiconductor devices employed for vehicle navigation systems, portable phones, information home appliances, etc. that have strongly been demanded of high performance and fast arithmetic operations and data processings at low power consumption. And the present invention can realize functions required for processings of high quality movie pictures and voices, as well as functions of image and voice recognition, etc. The present invention can thus also apply to semiconductor integrated circuits or semiconductor devices employed for information and control systems of vehicles, thereby realizing automatic driving and safety driving systems, etc. Furthermore, in the future, it is expected that the present invention will apply to super computers that have very high arithmetic performance and accordingly require indispensably low power consumption.

While the preferred form of the present invention has been described, it is to be understood that modifications will be apparent to those skilled in the art without departing from the spirit of the invention.

For example, the multiprocessor system of the present invention may be configured on multiple chips; there is no need to configure the system just on one chip. The multiprocessor system may also include PD-SOI/MOS transistors and bulk-structured MOS transistors. Furthermore, applying the body-bias controlling is just required for a circuit portion related to at least the arithmetic processing speed in each processor unit. The memory that stores the queuing table and the task scheduling table may be shared by plural processor units or the memory may be a local one provided for each processor unit.

What is claimed is:

1. A multiprocessor system, comprising:
a plurality of processor units that can operate in parallel;
a body-bias control circuit; and
a control processor unit,
wherein each of the processor units includes an internal circuit consisting of silicon-on-insulator-structured SOI/MOS transistors provided with a back gate electrode isolated from other MOS transistors respectively,
wherein each of the processor units is driven synchronously with a clock signal,
wherein the body-bias control circuit outputs a body-bias voltage to the back gate electrode of each of the SOI/MOS transistors of the internal circuit,
wherein the control processor unit makes task scheduling so as to enable the processor units to process a plurality of tasks in parallel by taking into consideration the dependency among those tasks,
wherein the control processor unit generates control data used to control the body-bias voltage and the frequency of the clock signal for each of the processor units and determines the control data upon making the task scheduling so as to shorten the processing time of a first task that could affect the start of the processing of one object task; and wherein the control processor unit, when a different task that could affect the start of the processing of the one object task is to be processed in parallel of the processing of the first task, determines the control data so as to raise the threshold voltage of the SOI/MOS transistors and lower the frequency of the clock signal with respect to the internal circuit of the processor unit that processes the different task so as not to end the processing of the different task after that of the first task.

2. The multiprocessor system according to claim 1, wherein the system includes a memory that stores a table that rules a relationship of the dependency among the tasks, and wherein the control processor unit refers to the table of the dependency relationship to know the dependency among the tasks.

3. The multiprocessor system according to claim 1, wherein the control processor unit determines the control data so as to reduce the threshold voltage of the SOI/MOS transistors and raise the frequency of the clock signal with respect to the internal circuit of the processor unit that processes the first task.

4. The multiprocessor system according to claim 1, wherein the control processor unit, when the one object task is to be processed after the completion of the first task processing, determines the control data so as to reduce the threshold voltage of the SOI/MOS transistors and raise the frequency of the clock signal with respect to the internal circuit of the processor unit that processes the first task.

5. The multiprocessor system according to claim 1, wherein the silicon-on-insulator structure is a perfect depletion type one.

6. The multiprocessor system according to claim 5, wherein each of the SOI/MOS transistors includes a first semiconductor layer formed on a semiconductor substrate through a buried oxide film; source and drain regions formed in the first semiconductor layer at the same thickness as that of the first semiconductor layer; a channel region formed between the source and drain regions; a first gate formed at a first main surface side of the channel region; and a second gate made of a conductive layer formed in adjacent to the bottom face of the buried oxide film, wherein the second gate is assumed to be the back gate electrode.

7. The multiprocessor system according to claim 6, wherein the system is formed on one semiconductor substrate.

8. A multiprocessor system, comprising:

a plurality of processor units that can operate in parallel; and a body-bias control circuit, wherein each of the processor unit includes an internal circuit consisting of silicon-on-insulator-structured SOI/MOS transistors provided with a back gate electrode isolated electrically from other MOS transistors respectively, wherein each of the processor units is driven synchronously with a clock signal, wherein the body-bias control circuit outputs a body-bias voltage to the back gate electrode of each of the SOI/MOS transistors of the internal circuit, wherein one processor unit makes task scheduling so as to enable the plurality of other processor units to process a plurality of tasks in parallel by taking into consideration the dependency among those tasks, wherein each of other processor units refers to the result of the task scheduling to control the processing of its object task (task execution management), wherein the one processor unit, upon making the task scheduling, generates control data used to control the body-bias voltage and the frequency of the clock signal for each of the processor units and determines the control data to shorten the processing time of a first task that could affect the start of the processing of one object task; and wherein the one processor unit, when a different task that could affect the start of the processing of the one object task is to be processed in parallel to the processing of the first task, determines the control data so as to raise the threshold voltage of the SOI/MOS transistors and lower the frequency of the clock signal with respect to the internal circuit of the processor unit that processes the different task so as not to end the processing of the different task after that of the first task.

9. The multiprocessor system according to claim 8, wherein the one processor unit, upon making the task scheduling, registers a scheduled task and its corresponding control data in a queuing table prepared for each processor unit, and wherein the processor unit refers to the corresponding queuing table in a task execution management process to obtain its processing object task and the corresponding control information.

10. The multiprocessor system according to claim 9, wherein the one processor unit, upon making the task scheduling, determines the control data so as to reduce the threshold voltage of the SOI/MOS transistors and raise the frequency of the clock signal with respect to the internal circuit of the processor unit that processes the first task.

11. The multiprocessor system according to claim 9, wherein the one processor unit, when the one object task is to be processed after the completion of the first task processing, determines the control data so as to reduce the threshold voltage of the SOI/MOS transistors and raise the frequency of the clock signal with respect to the processor unit that processes the first task.

\* \* \* \* \*